United States Patent
Dries et al.

(10) Patent No.: US 7,087,882 B1
(45) Date of Patent: Aug. 8, 2006

(54) CONTROLLING THE DYNAMIC RANGE OF AN AVALANCHE PHOTODIODE

(75) Inventors: J. Christopher Dries, Skillman, NJ (US); Darin J. Douma, Monrovia, CA (US); Rudolf J. Hofmeister, Sunnyvale, CA (US)

(73) Assignee: Finisar Corporation, Sunnyvale, CA (US)

( * ) Notice: Subject to any disclaimer, the term of this patent is extended or adjusted under 35 U.S.C. 154(b) by 219 days.

(21) Appl. No.: 10/698,558

(22) Filed: Oct. 31, 2003

Related U.S. Application Data

(60) Provisional application No. 60/423,175, filed on Oct. 31, 2002.

(51) Int. Cl.
*H01L 31/00* (2006.01)

(52) U.S. Cl. .................................. 250/214; 250/214 R

(58) Field of Classification Search ......... 250/214 LA, 250/207; 257/438, 603, 609, 611; 438/91; 398/138, 139, 141, 142
See application file for complete search history.

(56) References Cited

U.S. PATENT DOCUMENTS

| | | | |
|---|---|---|---|
| 4,194,935 A | | 3/1980 | Dingle et al. |
| 4,626,676 A | * | 12/1986 | Gerardin ................. 250/214 R |
| 5,548,112 A | * | 8/1996 | Nakase et al. .......... 250/214 C |
| 5,912,478 A | * | 6/1999 | Barrou et al. ................ 257/438 |
| 5,929,982 A | | 7/1999 | Anderson |
| 6,222,660 B1 | | 4/2001 | Traa |
| 6,465,803 B1 | | 10/2002 | Bowers et al. |
| 6,515,315 B1 | * | 2/2003 | Itzler et al. .................. 257/186 |
| 2003/0178552 A1 | * | 9/2003 | Hofmeister et al. .... 250/214 A |
| 2004/0106265 A1 | * | 6/2004 | Vickers ...................... 438/380 |

* cited by examiner

*Primary Examiner*—Georgia Epps
*Assistant Examiner*—Tony Lu
(74) *Attorney, Agent, or Firm*—Workman Nydegger

(57) ABSTRACT

An avalanche photodiode with a wide dynamic range. An avalanche photodiode with a wide dynamic range is used in fiber-optic communication applications where optical signals of varying powers may be received. The avalanche photodiode includes a field control layer. A doping thickness product can be configured to determine a dynamic range of the avalanche photodiode. The gain of the avalanche photodiode is controllable by adjusting a bias voltage across the avalanche photodiode.

20 Claims, 5 Drawing Sheets

CONTROLLING THE DYNAMIC RANGE OF AN AVALANCHE PHOTODIODE

CROSS-REFERENCE TO RELATED APPLICATIONS

This application claims the benefit of U.S. Provisional Application No. 60/423,175, titled CONTROLLING THE DYNAMIC RANGE OF AN AVALANCHE PHOTODIODE filed Oct. 31, 2002, which is incorporated herein by reference.

BACKGROUND OF THE INVENTION

1. The Field of the Invention

The invention generally relates to the field of fiber-optic communications. More specifically, the invention relates to the use of optimized avalanche photodiodes in fiber-optic transceivers.

2. The Relevant Technology

In the field of data transmission, one method of efficiently transporting data is through the use of fiber-optics. Digital data is propagated through an optical fiber using light emitting diodes or lasers. Light signals allow for high transmission rates and high bandwidth capabilities. Also, light signals are resistant to electromagnetic interferences that would otherwise interfere with electrical signals. Optical fibers do not typically allow portions of the light signal to escape from the optical fiber as can occur with electrical signals in wire-based systems.

In a typical fiber-optic network, the transmission and reception of data is not strictly limited to optical signals. Digital devices such as computers may communicate using both electronic and optical signals. As a result, optical signals need to be converted to electronic signals and electrical signals need to be converted to optical signals. To convert electronic signals to optical signals for transmission on an optical fiber, a transmitting optical subassembly (TOSA) is often used. A TOSA uses a electronic signal to drive a laser diode or light emitting diode to generate an optical signal. When optical signals are converted to electronic signals, a receiving optical subassembly (ROSA) is used. The ROSA has a photodiode that, in conjunction with other circuitry, converts the optical signals to electronic signals.

Because most computers and other digital devices both transmit and receive signals, most computers need both a TOSA and a ROSA to communicate through optical fibers. A TOSA and ROSA can be combined into an assembly generally referred to as a transceiver. Accordingly, most computers in a fiber-optic network are configured to communicate in a bidirectional nature by using a transceiver, meaning that they can both transmit and receive signals on the fiber-optic network.

Avalanche photodiodes (APDs) are well-known devices that may be used in a ROSA. APDs serve at least two functions: 1) conversion of optical signals into electrical signals, and 2) amplification of the electrical signal through avalanche multiplication. Typically, an APD has an absorption layer where an optical signal is absorbed. The optical signal includes a number of photons. Each photon impinging the absorption layer generates an electron-hole pair or a carrier. A multiplication layer in the APD is designed such that one carrier causes an avalanche of other carriers where the number of other carriers is dependent on the gain of the APD.

Fiber-optic transceivers intended for commercial distribution should be designed and manufactured such that they are functional in a number of different situations. For example, fiber-optic networks may differ in the distance between communication points, the type of fiber between communication points and in other ways. These differences result in differing amounts of signal attenuation in a fiber-optic channel.

One challenge that arises with the use of avalanche photodiodes in commercial transceiver applications is that typically the photodiodes are designed and implemented in a transceiver to achieve maximum gain. In other words, the photodiodes cause the maximum number of carriers to be generated in the multiplication layer when a photon contacts the photodiode. While in long-distance applications high gain is helpful in recovering optical signals, the same photodiodes may cause an overload of current to be delivered to components in a circuit with the photodiode, such as a post amplifier, when the photodiode is used in short distance applications or with optical fiber that exhibit little attenuation.

To effectively provide for this range of currents that may be delivered from the photodiode, namely low currents in long-distance applications and high currents in short distance applications, a post amplifier with a wide dynamic range may need to be implemented. Such amplifiers have various disadvantages including large size, high power consumption and high cost. These disadvantages are directly opposed to the optimal characteristics of transceivers which are compact size, low power use, and low cost.

BRIEF SUMMARY OF THE INVENTION

One embodiment of the invention includes a fiber-optic transceiver for use in optical communications. The fiber-optic transceiver may receive optical signals of varying powers. The fiber-optic transceiver includes an avalanche photodiode configured with a wide dynamic range. The fiber-optic transceiver also includes a power supply that supplies a bias voltage to the avalanche photodiode. The transceiver further includes a feedback mechanism that in response to the current through the avalanche photodiode controls the bias voltage.

Another embodiment invention includes a method for controlling the gain of optical signals received in fiber-optic communications. The method includes receiving an optical signal. The method also includes feeding the optical signal into an avalanche photodiode to induce a current to flow in the avalanche photodiode. The avalanche photodiode has a wide dynamic range. In response to current induced in the photodiode, the method includes adjusting a bias voltage across the avalanche photodiode to regulate the current induced by the avalanche photodiode.

Another embodiment the invention includes an avalanche photodiode for use in fiber-optic communications. The avalanche photodiode includes a field control layer with a doping thickness product selected to exhibit a wide dynamic range. The wide dynamic range is such that the gain of the avalanche photodiode is controllable by adjusting a bias voltage across the avalanche photodiode.

Advantageously, embodiments of the invention allow for the use of an avalanche photodiode with a wide dynamic range. This allows for the elimination of other expensive components with wide dynamic ranges such as special post amplifiers. This and other advantages and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

Embodiments of the present invention include an avalanche photodiode (APD) that is designed and manufactured with a wide dynamic range. This photodiode can be implemented in a transceiver that is intended for general use fiber-optic applications. The transceiver may be used in applications where there is little attenuation of an optical signal. The transceiver may also be used in applications where there is significant attenuation of an optical signal prior to the optical signal being input into the transceiver.

A current is induced in the APD by directing or focusing an optical signal into the APD. This current is subsequently fed into components in a circuit with the APD. Such a component may be a post amplifier and the like. The current of the photodiode can be regulated appropriately by adjusting the bias voltage across the avalanche photodiode. Using feedback principles, the bias voltage can be adjusted in response to the current induced in the APD. The wide dynamic range of the APD of the present invention accommodates a wide range of optical signal powers. The need for post amplifiers and other components with wide dynamic ranges is thus reduced or eliminated.

Figure 1:
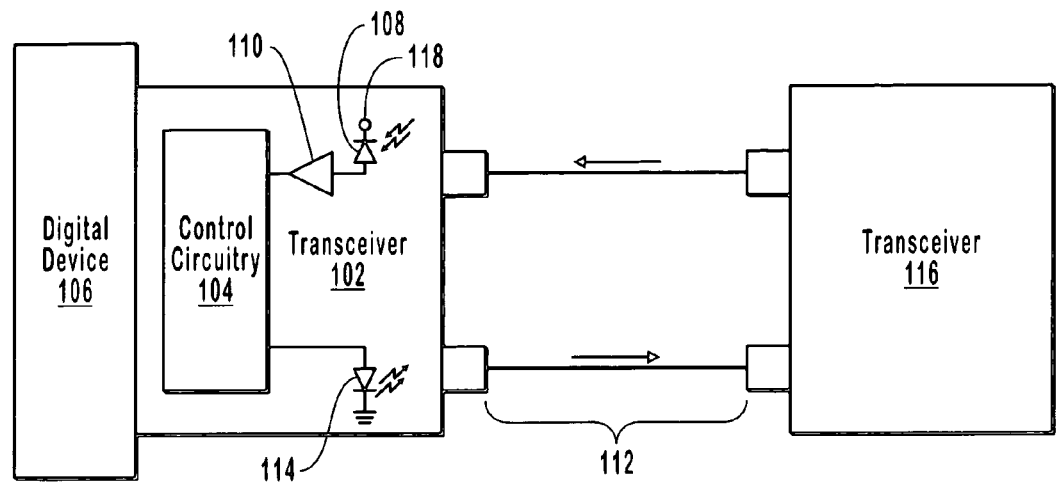
FIG. 1 illustrates an environment where aspects of the present invention may be practiced.

FIG. 1 illustrates one environment for implementing embodiments of the present invention. FIG. 1 shows a transceiver 102. The transceiver includes control circuitry 104 for interpreting communications signals and for relaying signals to a digital device 106. An avalanche photodiode 108 is connected to the control circuitry 104 through a post amplifier 110. The avalanche photodiode 108 receives optical signals from a fiber-optic network 112. The optical signals from the fiber-optic network 112 impinge the avalanche photodiode causing an electrical signal in the form of a current to flow through the avalanche photodiode 108. This current is fed into the post amplifier 110 and into the control circuitry 104. The gain of the avalanche photodiode 108 may be controlled by an avalanche photodiode bias voltage 118. By implementing an avalanche photodiode 108 with a wide dynamic range, the avalanche photodiode bias voltage 118 can be used to control the gain of the avalanche photodiode 108 over a wide range of optical signals. This allows for the use of a post amplifier 110 with a narrower dynamic range.

Signals from the digital device 106 are passed to the control circuitry 104. The control circuitry 104 is further connected to a laser diode 114. The laser diode 114 generates optical signals that are propagated onto the fiber-optic network 112. These optical signals may be sent to another transceiver 116 that may be connected to another digital device.

Figure 2:
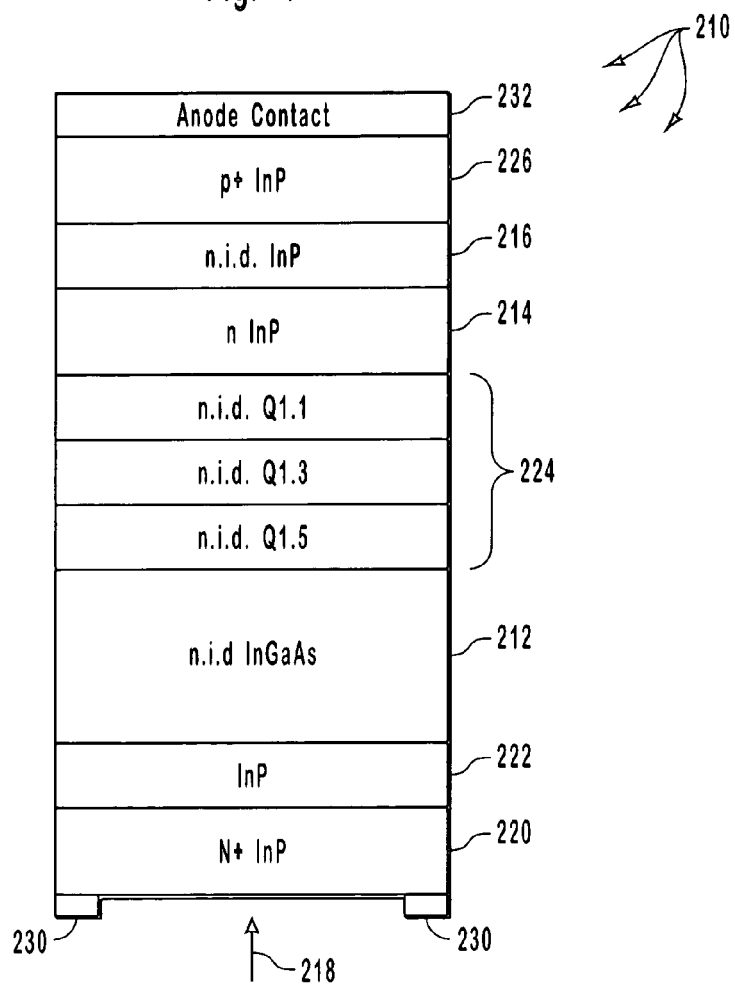
FIG. 2 illustrates an avalanche photodiode in accordance with certain aspects of the present invention.

FIG. 2 illustrates an exemplary embodiment of an APD 210 including an absorption layer 212, a field control layer 214, and a gain layer (also referred to as a multiplication zone) 216. A cathode contact 230 and an anode contact 232 are used to apply a bias voltage to the APD 210. An optical signal, usually having a wavelength between 0.9 μm and 1.7 μm, enters the APD 210 from the bottom of FIG. 2 (the cathode of APD 210), as shown by an arrow 218. The optical signal first passes through a substrate layer 220 which is transparent to some optical signals to reach the absorption layer 212. An InP layer 222 is formed between the substrate layer 220, which is an n$^+$ doped InP layer, and the absorption layer 212, which is an InGaAs layer, to keep the two layers separated. The optical signal is absorbed in the absorption layer 212 and one or more electron-hole pairs are generated. The notation "n.i.d." in FIG. 2 indicates that the layer is not intentionally doped.

The electron(s) and the hole(s) of the electron-hole pair migrate toward the anode and the cathode, respectively, causing a current to flow. The electrons traveling toward the anode pass through one or more quaternary speed up layers 224 and enter the field control layer 214, which is an n-doped InP layer. The quaternary speed up layers 224 are formed between the field control layer 214 and the absorption layer 212 to prevent holes from piling up at the InGaAs-InP interface. The doping thickness product of the field control layer 214 determines the dynamic range and the peak sensitivity of the APD 210. Greater peak sensitivity often requires a trade-off of lower dynamic range, and greater dynamic range often requires a trade-off of peak sensitivity. The electrons flowing toward the anode exit the field control layer 214 and enter the gain layer 216 where avalanche phenomenon creates an internal gain. The "avalanche" of electrons produced in the gain layer 216 reach the anode by passing through a p$^+$ doped InP layer 226.

During the operation of the APD 210, the gain layer 216 is subjected to a higher electric field than the absorption layer 212. The field control layer 214 keeps the gain layer 216 and the absorption layer 212 separated so that the two layers can be subjected to different magnitudes of electric field. The difference in the electric field levels of the gain layer 216 and the absorption layer 212 is a function of the doping thickness product of the field control layer 214. The doping thickness product, which is the product of the doping density of a dopant and the thickness of a layer (e.g., the field control layer), determines the bias voltage at which current begins to flow through the APD 210 and the magnitude of the electric field in the gain layer 216 relative to the electric field in the absorption layer 212. The difference in the electric field within the gain layer 216 and the electric field in the absorption layer 212 is herein referred to as $\Delta E$.

As the doping thickness product approaches zero, the magnitude of the electric field in the gain layer 216 becomes approximately equal to the magnitude of the electric field in the absorption layer 212. As a consequence, the punch-through voltage of the APD 210 is decreased and the breakdown voltage is raised, increasing the dynamic range and lowering the peak sensitivity of the APD 210. On the other hand, when the doping thickness product increases, the difference between the electric fields within the gain layer 216 and the absorption layer 212 also becomes larger. As this difference becomes larger, the punch-through voltage is increased. As a consequence the peak APD 210 sensitivity increases while the dynamic range decreases. By manipulating the doping thickness product, the desired dynamic range and peak sensitivity can be achieved.

The avalanche photodiode 210 may be formed using semiconductor manufacturing processes where layers are formed on one another. While the processes described herein may refer to forming certain layers on other layers, it is to be understood that the layers of the avalanche photodiode may be constructed in varying orders. Thus forming as used herein simply refers to one layer being disposed with a certain relation to another layer. For example, "forming between" does not require the outer layers to be formed prior to the inner layers, but simply requires the outer layers to be external to the inner layers. Additionally, forming a first layer on a second layer does not require that either layer be formed prior to the other.

Figure 3:
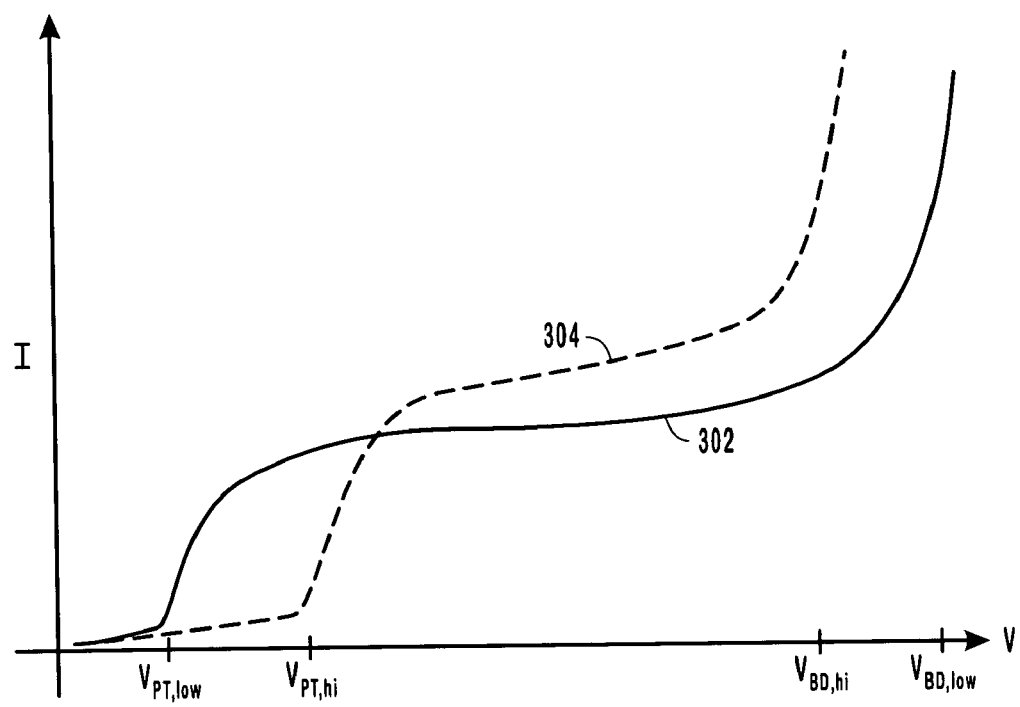
FIG. 3 illustrates current-voltage curves for avalanche photodiodes with low doping thickness product and high doping thickness product.

FIG. 3 depicts the relative current to voltage (I-V) characteristics of a low doping thickness product APD (see the solid line 302) and a high doping thickness product APD (see the broken line 304). Each I-V plot shows a punch-through voltage ($V_{PT}$), which is the voltage at which a current starts to flow through the APD 210. The punch-through voltage when the field control layer 214 has a low doping thickness product ($V_{PT,\ low}$) is lower than the punch-through voltage when the field control layer 214 has a high doping thickness product ($V_{PT,\ hi}$). Each I-V plot also shows a breakdown voltage ($V_{BD}$), which is when the current through the APD 210 becomes so high that the current no longer provides a signal. The breakdown voltage is higher when the field control layer 214 has a low doping thickness product ($V_{BD,\ low}$) than when the field control layer 214 has a high doping thickness product ($V_{BD,\ hi}$). Having a lower punch-through voltage and a higher breakdown voltage, an APD including a field control layer with a low doping thickness product operates at a greater range of signal strengths than an APD with a high-doping thickness product field control layer 214. Thus, lowering the doping thickness concentration results in a higher dynamic range.

Figure 4A:
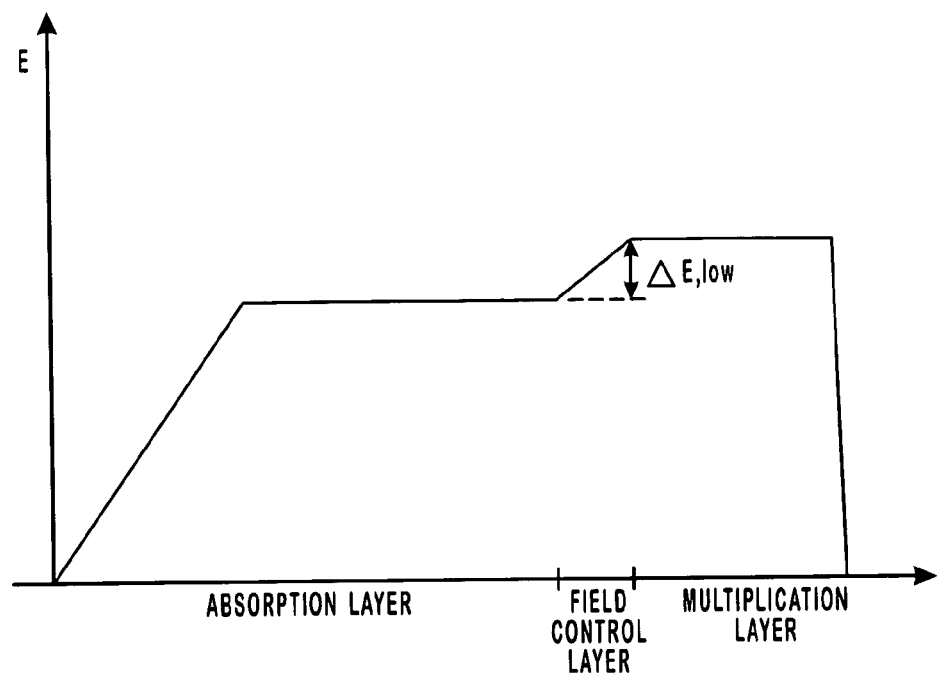
FIG. 4A illustrates a schematic representation of the relative electric field strength of a low doping thickness product avalanche photodiode.
Figure 4B:
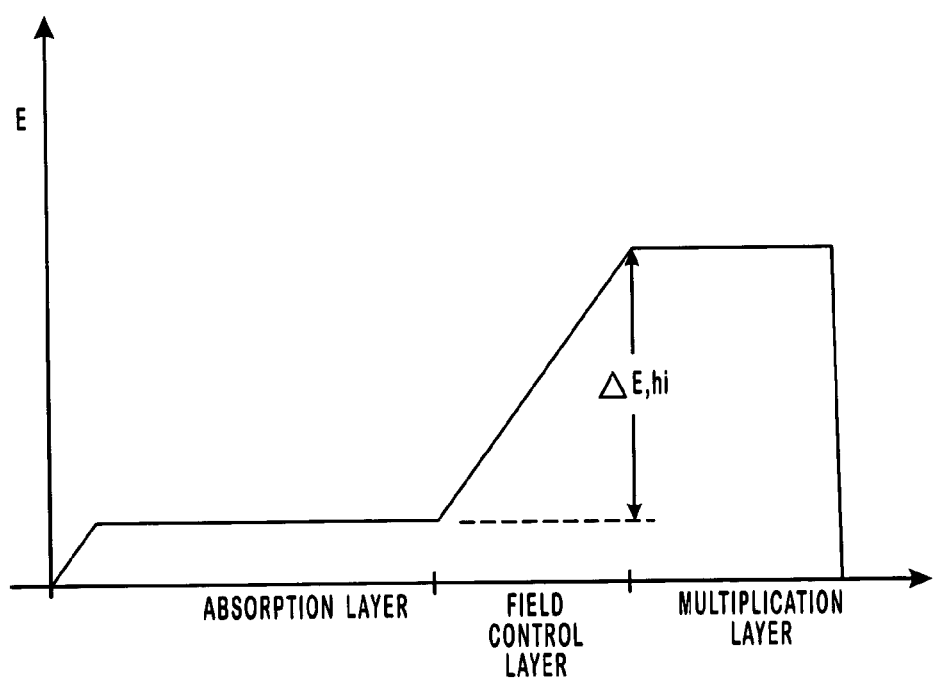
FIG. 4B illustrates a schematic representation of the relative electric field strength of a high doping thickness product avalanche photodiode.

FIG. 4A and FIG. 4B depict schematically the relative electric field strengths of a high doping thickness product APD and a low doping thickness product APD, respectively. The APD of FIG. 4A and the APD of FIG. 4B have substantially similar outer dimensions. However, $\Delta E_{low}$ for an APD with a high doping thickness product is smaller than the $\Delta E_{hi}$ for an APD with a low doping thickness product. By tailoring the doping concentration in the field control layer 214, one can manipulate the electric field strength difference between the absorption layer 212 and the gain layer 216 and ultimately the peak sensitivity and the dynamic range of the APD 210.

Figure 4C:
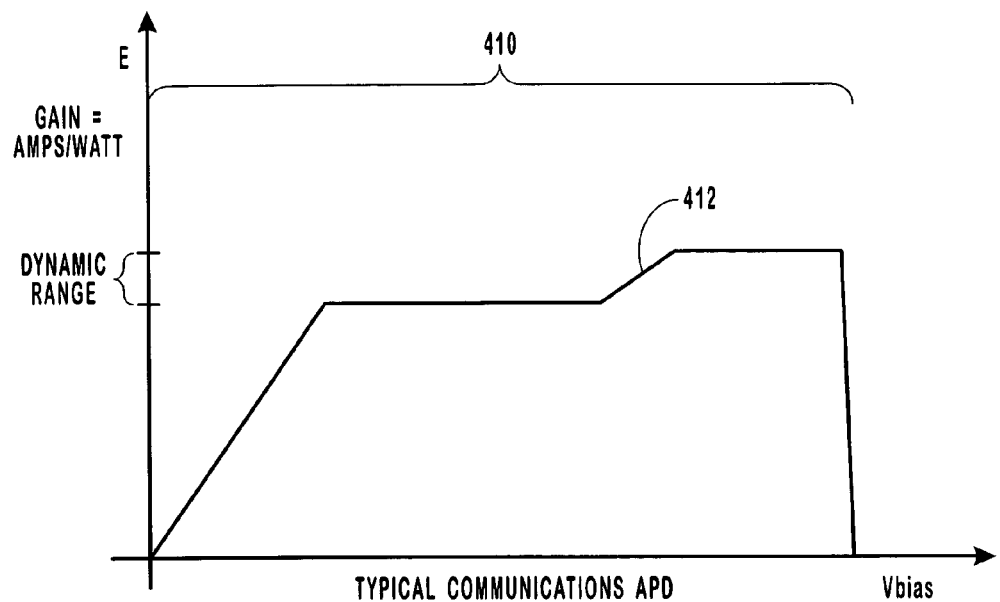
FIG. 4C illustrates a schematic representation of a gain curve for an avalanche photodiode with a low doping thickness product.
Figure 4D:
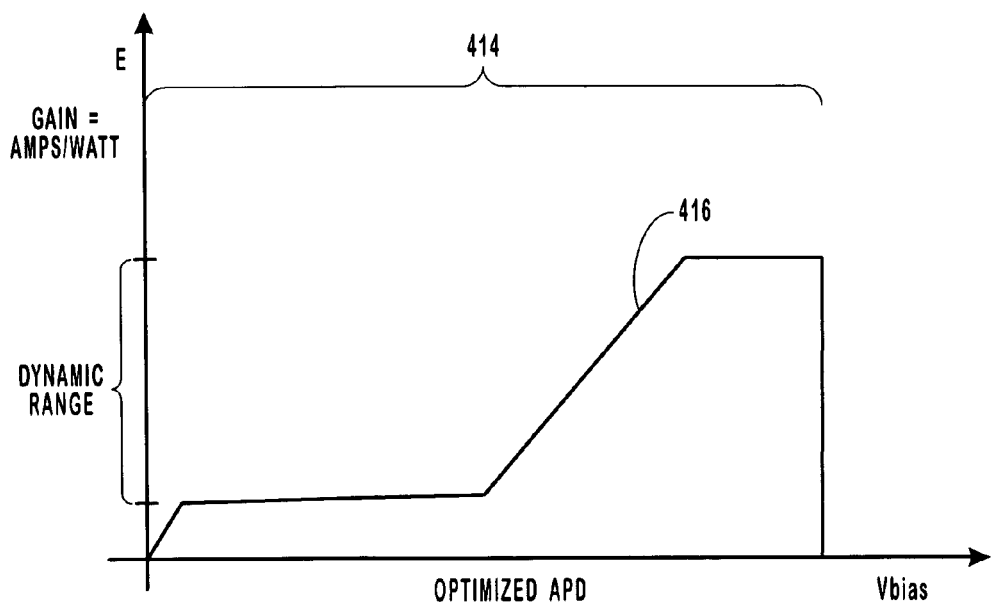
FIG. 4D illustrates a schematic representation of a gain curve for an avalanche photodiode with a high doping thickness product.

FIGS. 4C and 4D schematically depict APD gain curves. The ADP gain curves graph gain, in amps per Watt, against a bias voltage. By choosing a bias voltage that causes the APD to operate in the avalanche region, effective optical signal amplification can be achieved. Specifically FIG. 4C depicts the APD gain curve 410 for an APD with a high doping thickness product. The dynamic range of an APD is determined by the size of the avalanche region 412 portion of the gain curve 410. As illustrated by FIG. 4C, the dynamic range of the APD with a high doping thickness product is somewhat limited. FIG. 4D illustrates an APD gain curve for an APD with a low doping thickness product. By examining the avalanche region 416 of the APD gain curve 414, it is evident that the dynamic range for an APD with a low doping thickness product is considerably wider than the dynamic range for an APD with a high doping thickness product. By varying the bias voltage across the avalanche region, the amount of current per photon in an optical signal can be controlled.

Specifically, in a fiber-optic transceiver when the fiber-optic transceiver is installed in an application with longer lengths of fiber-optic fiber between communication points, the bias voltage can be set such that the optical gain is high. This allows the fiber-optic transceiver to recover weak fiber-optic signals. In applications where the lengths of fiber-optic fiber between communication points is shorter or when the type of fiber is a low loss fiber, the bias voltage across the APD can be set such that the optical gain is lower.

An APD with a wide dynamic range may be designed for specific general purpose applications. By knowing the range of optical signals that are expected to be received by a ROSA, the APD for use with the ROSA can be designed to appropriately amplify signals along that range. Specifically, the APD can be designed such that the lower portion of the avalanche region 416 corresponds to a desired gain when the highest expected power optical signals are received. The upper portion of the avalanche region 416 corresponds to a desired gain when the lowest expected power optical signals are received.

In some embodiments of the invention, a lower actual peak gain or peak sensitivity may be caused by increasing the dynamic range of the APD 210. This loss of peak gain may be counteracted by limiting the fiber length used with a transceiver incorporating an APD with a wide dynamic range, or by compensating for the loss of peak gain by increasing the gain of other components such as the post amplifier and the like.

Figure 5:
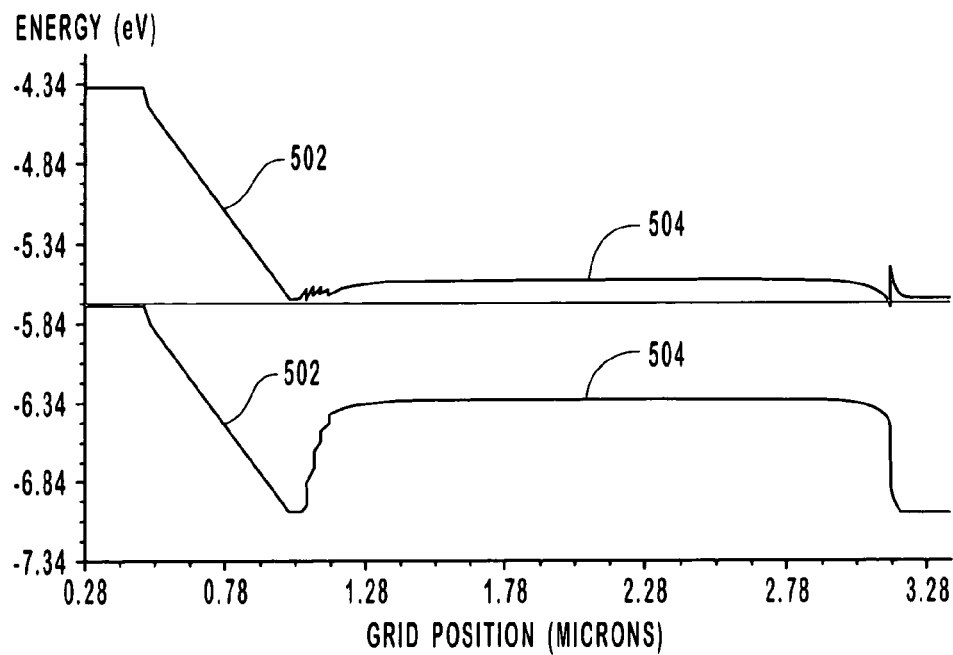
FIG. 5 illustrates curves depicting a band gap diagram for avalanche photodiodes with low doping thickness products and high doping thickness products.

FIG. 5 depicts the potential energy levels of an electron in an APD having a high doping thickness product and an electron in an APD having a low doping thickness product. The energy levels are shown as a function of the APD height, the left portion representing the energy level near the anode of the APD 210 and the right portion representing the energy level near the cathode of the APD 210. The negative slope 502 represents the energy level of an electron in the gain layer 216, and the plateau portion 504 represents the energy level of an electron in the absorption layer 212.

While the foregoing has been with reference to a particular embodiment of the invention, it will be appreciated by those skilled in the art that changes in this embodiment may be made without departing from the principles and spirit of the invention. For example, the invention is not limited to APDs of the particular compositions and layers depicted in FIG. 2 but may be applied to APDs of different compositions and layers.

Figure 6A:
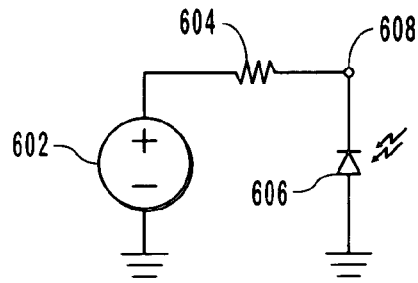
FIG. 6A illustrates an avalanche photodiode biased with a feedback resistor.
Figure 6B:
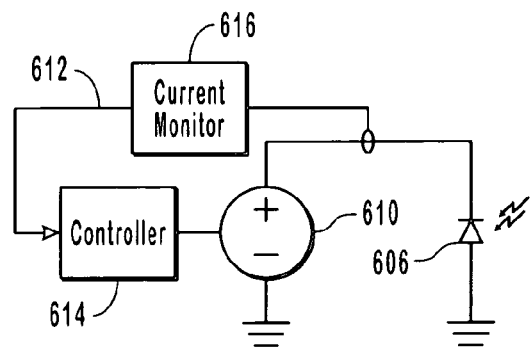
FIG. 6B illustrates an avalanche photodiode biased with a controllable voltage source.

FIGS. 6A and 6B depict two alternative methods that may be used in embodiments of the present invention. FIG. 6A depicts a power supply 602 in series with a resistor 604 in series with an avalanche photodiode 606 in an APD circuit. APDs typically require a bias voltage considerably higher than voltages that are available to a transceiver. Thus a transceiver may include the power supply 602 that converts voltages available to the transceiver to a higher voltage to bias the APD. The power supply 602 may therefore be a boost converter or other appropriate power supply for converting voltages available at a transceiver to voltages suitable for biasing the avalanche photodiode 606. In other embodiments of the invention, the power supply may include circuitry to receive a voltage sufficient to bias an APD.

The bias voltage for the avalanche photodiode 606 appears at a node 608. The resistor 604 is selected such that the voltage at the node 608 will be higher when there are weaker optical signals and lower when the optical signals are stronger. Resistor 604 acts as a feedback mechanism. As more current flows through the avalanche photodiode 606, more voltage is dropped across the resistor 604 according to Ohms law in which the voltage dropped across the resistor 604 is equal to the current flowing through the resistor 604 and the avalanche photodiode multiplied by the value of the resistor 604. This type of feedback mechanism is useful in transceiver applications where there is less concern about power that may need to be dissipated across the resistor 604.

The resistor 604 can be selected by designing the APD circuit with certain boundary conditions in mind. For example, the APD circuit including the resistor 604, may be designed using the maximum and minimum expected power from an optical signal for use with the APD circuit. By varying the voltage of the power supply 602, the size of the resistor 604, and the dynamic range of the APD 606, an APD circuit can be optimized.

In applications where there is a need to conserve power, a biasing arrangements such as that shown in FIG. 6B may be implemented. FIG. 6B shows a power supply 610 connected directly to an avalanche photodiode 606. The feedback loop 612 measures the current flowing through the avalanche photodiode 606. This value of current is digitized and fed into a controller 614. The controller 614 then actively controls the power supply 610 to maintain an optimal bias voltage. This bias voltage is some value that causes the avalanche photodiode 606 to operate in the avalanche region such as the avalanche region 416 shown in FIG. 4D.

The current can be monitored by the feedback loop using several current monitors as depicted by current monitor 616. For example, the current may be measured using a current monitor 616 implemented as a current mirror circuit. Alternatively, a small sensing resistor may be placed in series with the APD 606 and the voltage across the small sensing resistor measured. According to Ohms law, current passing through the sensing resistor and the APD 606 would cause a proportional voltage across the sensing resistor. This voltage could be fed into the controller 614 for controlling the power supply 610. Yet another implementation of current monitor 616 for monitoring the current through the APD 606 may be current transformers and the like.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A fiber-optic transceiver for use in optical communications where the fiber-optic transceiver may receive optical signals of varying powers, the fiber-optic transceiver comprising:

an avalanche photodiode comprising:
 a gain layer;
 an absorption layer; and
 a field control layer disposed between the gain layer and the absorption layer, the field control layer having a doping thickness product that determines a dynamic range and is a product of a density of a dopant and a thickness of the field control layer;
a power supply that supplies a range of bias voltages to the avalanche photodiode, wherein the doping thickness product of the field control layer causes the avalanche photodiode to operate in an avalanche region when biased by a bias voltage in the range of bias voltages and wherein a relation between the doping thickness product and an avalanche photodiode punch through voltage, breakdown voltage and dynamic range is such that for a first doping thickness product that is less than a second doping thickness product:
 a punch through voltage associated with the first doping thickness product is relatively lower than a punch through voltage associated with the second doping thickness product;
 a breakdown voltage associated with the first doping thickness product is relatively greater than a breakdown voltage associated with the second doping thickness product; and
 a dynamic range associated with the first doping thickness product
is relatively greater than a dynamic range associated with the second doping thickness product; and
a feedback mechanism that controls the bias voltage in response to the current through the avalanche photodiode.

2. The fiber-optic transceiver of claim 1, the feedback mechanism comprising a resistor in series with the avalanche photodiode.

3. The fiber-optic transceiver of claim 1, the feedback mechanism comprising a current monitor that monitors the current through the photodiode, the power supply voltage being adjusted based on the value of the current through the photodiode.

4. The fiber-optic transceiver of claim 3, the current monitor comprising a current mirror.

5. The fiber-optic transceiver of claim 3, the current monitor comprising a sensing resistor.

6. The fiber-optic transceiver of claim 3, the current monitor comprising a current transformer.

7. A method for controlling the gain of optical signals received in fiber-optic communications, the method comprising:

receiving an optical signal;
directing the optical signal into an avalanche photodiode to induce a current to flow in the avalanche photodiode, the avalanche photodiode having a field control layer with a doping thickness product that determines a width of an avalanche region that is associated with a range of bias voltages, wherein adjusting the doping thickness product adjusts a punch-through voltage and a breakdown voltage to cause an adjustment in a dynamic range or a peak sensitivity;

in response to the current induced in the photodiode, adjusting a bias voltage within the range of bias voltages across the avalanche photodiode to regulate the current induced by the avalanche photodiode such that the avalanche photodiode operates in the avalanche region.

8. The method of claim 7 further comprising monitoring the current induced in the avalanche photodiode using a current mirror.

9. The method of claim 7 further comprising monitoring the current induced in the avalanche photodiode by measuring a voltage across a sensing resistor in series with the avalanche photodiode.

10. The method of claim 7 further comprising monitoring the current induced in the avalanche photodiode by measuring a current through a current transformer.

11. A method of manufacturing an avalanche photo diode for use in fiber-optic communications the method comprising:

forming a field control layer between an absorption layer and a gain layer, the field control layer having a doping thickness product selected to determine a width of a dynamic range such that the gain of the avalanche photodiode is controllable by adjusting a bias voltage across the avalanche photodiode to cause the avalanche photodiode to operate along the dynamic range and wherein lowering the doping thickness product lowers a punch-through voltage and raises a breakdown voltage to increase the dynamic range.

12. The method of claim 11, further comprising configuring the doping thickness product such that a lower portion of the dynamic range corresponds to a desired gain when highest expected power optical signals are received and an upper portion of the dynamic range corresponds to a desired gain when lowest expected power optical signals are received by the avalanche photodiode.

13. The method of claim 11, wherein forming a field control layer comprises forming the field control layer as an n$^-$ doped InP layer.

14. The method of claim 11, further comprises forming the absorption layer as a InGaAs layer.

15. The method of claim 11, further comprising forming at least one quaternary speed up layer between the field control layer and the absorption layer to prevent holes from piling up between the absorption layer and the field control layer.

16. The method of claim 11, further comprising forming a p$^+$ doped InP layer on the gain layer.

17. The method of claim 11, further comprising increasing a doping thickness product to raise a punch-through voltage and lower a breakdown voltage to increase a peak sensitivity.

18. The method of claim 11, further comprising lowering a doping thickness product to adjust an electric field in the absorption layer and decrease an electric field in the gain layer.

19. A fiber-optic transceiver for use in optical communications where the fiber-optic transceiver may receive optical signals of varying powers, the fiber-optic transceiver comprising:

an avalanche photodiode comprising:
  a gain layer;
  an absorption layer; and
  a field control layer disposed between the gain layer and the absorption layer, the field control layer having a doping thickness product that determines a dynamic range and is a product of a density of a dopant and a thickness of the field control layer;

a power supply that supplies a range of bias voltages to the avalanche photodiode, wherein the doping thickness product of the field control layer causes the avalanche photodiode to operate in an avalanche region when biased by a bias voltage in the range of bias voltages and a variation in the doping thickness product corresponds with a variation in a punch through voltage and in a breakdown voltage, and the variation in the punch through voltage and the breakdown voltage corresponding with a variation in the dynamic range or in a peak sensitivity; and a feedback mechanism that controls the bias voltage in response to the current through the avalanche photodiode.

20. The fiber-optic transceiver of claim 19, the feedback mechanism comprising a current monitor that monitors the current through the photodiode, the power supply voltage being adjusted based on the value of the current through the photodiode.

* * * * *

UNITED STATES PATENT AND TRADEMARK OFFICE
CERTIFICATE OF CORRECTION

PATENT NO. : 7,087,882 B1  Page 1 of 1
APPLICATION NO. : 10/698558
DATED : August 8, 2006
INVENTOR(S) : Dries et al.

It is certified that error appears in the above-identified patent and that said Letters Patent is hereby corrected as shown below:

Column 2
Line 45, after "embodiment" insert --of the--
Line 55, after "embodiment" insert --of--

Column 6
Line 10, after "Specifically" insert --,--

Signed and Sealed this

Third Day of August, 2010

David J. Kappos
*Director of the United States Patent and Trademark Office*